United States Patent
Lee

(10) Patent No.: US 9,401,435 B2
(45) Date of Patent: Jul. 26, 2016

(54) RECONFIGURABLE ELECTRONIC DEVICES AND OPERATION METHOD THEREOF

(71) Applicant: SNU R&DB FOUNDATION, Seoul (KR)

(72) Inventor: Jong-Ho Lee, Seoul (KR)

(73) Assignee: SNU R&DB FOUNDATION (KR)

( * ) Notice: Subject to any disclaimer, the term of this patent is extended or adjusted under 35 U.S.C. 154(b) by 0 days.

(21) Appl. No.: 14/828,750

(22) Filed: Aug. 18, 2015

(65) Prior Publication Data
US 2016/0056301 A1 Feb. 25, 2016

(30) Foreign Application Priority Data
Aug. 22, 2014 (KR) .................. 10-2014-0109727

(51) Int. Cl.
*G11C 16/12* (2006.01)
*H01L 29/792* (2006.01)
*H01L 29/78* (2006.01)
*H01L 29/423* (2006.01)
*G11C 16/14* (2006.01)
*G11C 16/04* (2006.01)

(52) U.S. Cl.
CPC .............. *H01L 29/792* (2013.01); *G11C 16/12* (2013.01); *H01L 29/4234* (2013.01); *H01L 29/78391* (2014.09); *G11C 16/0466* (2013.01); *G11C 16/14* (2013.01)

(58) Field of Classification Search
CPC .... G11C 16/12; G11C 16/14; G11C 16/0466; H01L 29/47; H01L 29/792; H01L 29/4234; H01L 29/7839
USPC ......... 365/184, 185.29, 185.27; 257/318, 319
See application file for complete search history.

(56) References Cited

U.S. PATENT DOCUMENTS

| | | | |
|---|---|---|---|
| 8,350,602 B2 | 1/2013 | Hong et al. | |
| 2011/0089404 A1* | 4/2011 | Marcus | B82Y 30/00 257/29 |
| 2013/0313524 A1* | 11/2013 | De Micheli | H01L 29/775 257/29 |
| 2014/0362644 A1* | 12/2014 | Lue | H01L 27/092 365/185.17 |

OTHER PUBLICATIONS

Yu-Ming Lin et al., High-Performance Carbon Nanotube Field-Effect Transistor With Tunable Polarities, IEEE Transactions on Nanotechnology, 2005, pp. 481-489.

(Continued)

*Primary Examiner* — Hoai V Ho
*Assistant Examiner* — Jay Radke
(74) *Attorney, Agent, or Firm* — Cantor Colburn LLP

(57) ABSTRACT

Provided is a reconfigurable electronic device which is implemented by forming independent upper gates and lower gates, wherein in comparison with an existing reconfigurable electronic device having the same function, a degree of integration is greatly increased, a non-volatile memory function is included in the device, and in operation of a reconfigurable circuit based on an independent lower electrode array, dynamic parasitic component is decreased and a complexity of wire lines can be reduced, so that power consumption can be reduced. In addition, in comparison with an existing reconfigurable electronic device, the device exhibits remarkably excellent performance in terms of various characteristics such as diversity of functions of a multi-functional device, alignment margin in process, performance of implementation of infinitesimal electrical doping in a channel, compatibility with bottom-up and top-down method in process, and compatibility with a 1D or 2D material.

19 Claims, 8 Drawing Sheets

(56) References Cited

OTHER PUBLICATIONS

André Heinzig et al., Reconfigurable Silicon Nanowire Transistors, Nano Letters, 2012, pp. 119-124.
Massimo Mongillo et al., Multifunctional Devices and Logic Gates With Undoped Silicon Nanowires, Nano Letters, 2012, pp. 3074-3079.
André Heinzig et al., Dually Active Silicon Nanowire Transistors and Circuits with Equal Electron and Hole Transport, Nano Letters, 2013, pp. 4176-4181.
Jens Trommer et al., Elementary Aspects for Circuit Implementation of Reconfigurable Nanowire Transistors, IEEE Electron Device Letters, 2014, pp. 141-143.

* cited by examiner

RECONFIGURABLE ELECTRONIC DEVICES AND OPERATION METHOD THEREOF

FUNDING STATEMENT

This invention was supported by Samsung Research Funding Center of Samsung Electronics under Project Number SRFC-IT1301-08.

CROSS-REFERENCE TO RELATED PATENT APPLICATION

This application claims the benefit of Korean Patent Application No. 10-2014-0109727, filed on Aug. 22, 2014, in the Korean Intellectual Property Office, the disclosure of which is incorporated herein in its entirety by reference.

BACKGROUND OF THE INVENTION

1. Field of the Invention

The present invention relates to a reconfigurable electronic device and, more particularly, to a reconfigurable electronic device having a non-volatile memory function which can be reconstructed by implementing independent lower electrodes including the non-volatile memory function and electrically adjusting a body of a 1D or 2D material or a thin semiconductor thin film.

2. Description of the Prior Art

Si-based sub-8 nm 3D (three-dimensional) devices are expected to be used in 2020s. Due to limitations in structure, material, and characteristics of the Si-based device, new next-generation semiconductor materials and new device s have been increasingly demanded. As countermeasure for overcoming the limitations, 1D semiconductor materials of Si nanowire or carbon nanotube have drawn attention due to characteristics such as quasi-ballistic transport, steep sub-threshold swing, and ideal electrostatic coupling. In addition, functions of freely independently adjusting a threshold voltage and a polarity (n-type or p-type) of an FET using the aforementioned 1D material have been known as a core technique in a reconfigurable circuit technique. As an example of the technique, there was a research for a change in polarity (n-type or p-type) of a device using a gate electrode capable of independently applying a voltage to an SWNT device (refer to Non-Patent Document 1) published in 2005.

In addition, as an example of recent researches (refer to Non-Patent Documents 2 to 5), there is a device capable of changing the type from a pMOSFET to an nMOSFET and vice versa by forming Schottky junctions by forming $NiS_2$ at both ends of a lightly-doped Si nanowire, forming a gate insulating film, and after that, adjusting resistance of Schottky junctions using two gate electrodes formed to be isolated from each other in the vicinity of the two Schottky junctions or selectively supplying electrons or holes. It has been reported that a circuit where two unit devices are connected in series based on the change in type of the FET (namely, the same device being changed among the three types of pMOSFET, nMOSFET, and resistor) is implemented to simply change a PMOS inverter into an NMOS inverter or a complementary inverter in operating characteristics. However, the implemented inverter has a shortcoming in time response characteristic in that actual operation speed is several seconds (refer to Non-Patent Document 4). In addition, with respect to a reconfigurable circuit where the number of unit devices is two to four, there is no actual implementation of a circuit where a NOR gate is changed into a NAND gate due to essential problems in a device structure or a manufacturing process.

In the current level of the technique, simulation of operations of logic gates is merely demonstrated (refer to Non-Patent Document 5). Therefore, the reconfigurable circuits published heretofore are good in terms of the studies, but the devices themselves have essential problems as follows. First, in the implementation of the device using the junction between the Si nanowire and the $NiS_2$, there is an essential problem in accurate control of the position of the junction in the manufacturing process. In addition, in the implementation of two top-gates, the two top-gates are not self-aligned with the junction, so that parasitic resistance or capacitance component is greatly increased. Second, in the changing of the type of the device (for example, nMOSFET→pMOSFET), a voltage is always applied to one of the two top-gates, and thus, the number of wire lines and the parasitic component are increased. In order to solve this problem, although a non-volatile memory function can be applied to a gate insulating film, an Eot (equivalent thickness of oxide) is increased, so that current driving performance is greatly deteriorated, and a channel length cannot be miniaturized. Third, even in the case where the device is operated as any type of the MOSFETs, one of the source and the drain necessarily has a Schottky junction, and thus, large low-frequency noise occurring in the Schottky junction essentially limits the applications of the devices. Fourth, in the case where a top-gate-based reconfigurable electronic device or a multi-functional device is implemented according to the technique in the related art, since the area for implementing the unit device becomes large, there is a problem in that a degree of integration is greatly lowered in the implementation of the circuit.

In addition, in the reconfigurable electronic devices according to the technique in the related art, the electrically-formed junction becomes a drain junction and the Schottky junction becomes a source junction, so that off current is small. In the circuit, the positions of the source and the drain are arbitrarily changed, and thus, there is a large shortcoming in terms of off current.

In the specification, the first technique in the related art is a technique disclosed in Non-Patent Documents 2, 4, and 5, the second technique in the related art is a technique disclosed in Non-Patent Document 3, the third technique in the related art is a technique disclosed in Patent Document 2, and the fourth technique in the related art is a technique disclosed in Patent Document 1.

Patent Document 1 mentioned above is U.S. Pat. No. 8,350,602B2, Patent Document 2 is US Patent Application Publication No. US 2013/0313524A1.

In addition, Non-Patent Document 1 is Y. M. Lin, J. Appenzeller, J. Knoch, and P. AVouris, "High-Performance Carbon Nanotube Field-Effect Transistor With Tunable Polarities", IEEE Trans. Natotech., vol. 4, no. 5, p. 481-488, 2005.

Non-Patent Document 2 is A. Heingzig, S. Slesazeck, F. Kreupl, T. Mikolajick, and W. M. Weber, "Reconfigurable Silicon Nanowire Transistors", Nano Lett. vol. 12, pp. 119-124, 2012.

Non-Patent Document 3 is M. Mongillo, P. Spathis, G. Katsaros, P. Gentile, and S. D. Franceschi, "Multifunctional Devices and Logic Gates With Undoped Silicon Nanowires, Nano Lett. vol. 12, pp. 3074-3079, 2012.

Non-Patent Document 4 is A. Heingzig, T. Mikolajick, J. Trommer, D. Grimm, and W. M. Weber, "Dually Active Silicon Nanowire Transistors and Circuits with Equal Electron and Hole Transport", Nano Lett. vol. 13, pp. 4176-4181, 2013.

Non-Patent Document 5 is J. Trommer, A. Heinzig, S. Slesazeck, T. Mikolajick, and W. M. Weber, "Elementary Aspects for Circuit Implementation of Reconfigurable Nanowire Transistors", IEEE Electron Device Lett. vol. 35, no. 1, pp. 141-143.

SUMMARY OF THE INVENTION

The present invention is to solve problems occurring in a reconfigurable electronic device and circuit based on Si nanowire (NW) device implemented in a top-down or bottom-up method of the related art. The following limitations intend to be solved by using a 2D material such as top-down-based graphene nanoribbon, TMDC (transition metal dichalcogenides), or phosphorene or by using a reconfigurable electronic device having non-volatile memory characteristics including a divided lower electrode structure capable of applying independent voltage based on a semiconductor thin film (Si thin film or Metal Oxide semiconductor thin film) or a bottom-up-based single-walled carbon nanotube (in the specification, if there is no particular comment, a carbon nanotube) (Single Walled Carbon Nanotubes; SWNTs).

First, in the reconfigurable electronic device of the related art, in the implementation of the device using the junction between the Si nanowire and the Ni silicide, there is an essential problem in accurate control of the position of the junction, and in the implementation of the two top-gates, the two top-gates are not self-aligned with the junction, so that the parasitic resistance or the capacitance component is greatly increased. In order to solve the problem, in the present invention, gate electrodes are located in a lower portion so as to freely adjust the resistance of Schottky junction of the device; and in order to accurately control the positions of the gate electrodes, the source and drain electrodes, and the channel in the device, photolithography process is used, so that reproducibility of position control and adjustability of position are to be improved.

Second, in the reconfigurable electronic device of the related art, in the changing of the type of the device (for example, nMOSFET→pMOSFET), a voltage is always applied to one of the two top-gates, and thus, voltage coupling with other wire lines and leakage current may occur, so that the degree of freedom of the wire lines is greatly decreased. In order to solve the problem, in the reconfigurable electronic device of the related art, although the non-volatile memory function can be applied to the gate insulating film, the Eot is increased, so that current driving performance is greatly deteriorated, and it is difficult to achieve miniaturization down to an infinitesimal channel length range (L<10 nm). In order to solve the problem, in the present invention, an lower electrode array which is independently applied with voltages and a lower gate insulating film including a non-volatile memory function are configured, and a body of a 1D or 2D material or a semiconductor thin film is introduced thereto, and after that, source and drain electrodes are formed by using a photolithography process. Therefore, in the present invention, by introducing the lower electrode structure, adjusting the channel threshold voltage and the Schottky barriers between the first and second upper electrodes and the body by using the lower electrodes, adjusting gates of a channel by using upper electrodes, the limitation in the gate insulating film which is thickened so as to include the memory function intends to be solved.

Third, in the reconfigurable electronic device of the related art, even in the case where the device is operated as any type of the MOSFETs, one of the source and the drain necessarily has a Schottky junction, and thus, if a reverse bias is applied to the Schottky junction, large low-frequency noise occurring in the Schottky junction essentially limits applications of the device.

As a reference, in the case where an electrically-formed junction becomes a drain junction and a Schottky junction between the source electrode and the channel layer is controlled by the gate electrode, although off current can be reduced, the positions of the source and the drain are arbitrarily changed in the circuit, which may be a large shortcoming in terms of the off current.

Fourth, in the reconfigurable electronic device of the related art, in order to adjust the Schottky barrier of the junction between the Si nanowire and the Ni silicide, upper gate electrodes are configured so as to surround the junctions located in the vicinity of the source and the drain. Therefore, the reconfigurable electronic device needs to be designed and implemented in consideration of a width of the upper gate electrode and a minimum separation distance between the electrode and the gate electrode or a line width (F). In this case, in consideration of the separation distance (F) between the gate electrodes as well as the width of the voltage-adjustable independent gate electrode formed between the channels, that is, the separation distance between the source and the drain, the reconfigurable electronic device needs to be implemented, so that the minimum channel length which can be implemented is increased. As a result, in miniaturization of the channel length, essential limitation occurs, and the area required to implement the reconfigurable unit device is increased, so that a degree of integration is lowered. In the present invention, in order to complement the shortcomings in terms of the degree of integration described above, a lower electrode for adjusting the Schottky barrier and the threshold value of the channel is located under the body, so that the area required to implement the independent lower electrode can be reduced while implementing the function of the independent lower electrodes. Therefore, the degree of integration can be improved.

Fifth, in the reconfigurable electronic device of the related art, in order to implement several independent gate electrodes on the upper layer of the channel, as the separation distance between the gate insulating film and the gate metal is minimized, the difficulty of the process of implementing multiple independent gate wire lines is increased due to the limitation in the minimum area for maintaining an adhesive force between the metal and the gate insulating film. Therefore, in the reconfigurable electronic device of the related art, there are various problems in process such as short-circuit between the metal wire lines or disconnection of infinitesimal independent gate wire lines. In addition, in the reconfigurable electronic device of the related art, there is a problem in that, as the number of independent gates is increased, the channel length is also increased. As a result, in the structure of the reconfigurable electronic device of the related art, as the number of independent gates which can be implemented is increased, the implementation of the multi-functional device which can be changed is limited. For example, in the case where the number of gate of the channel which can be adjusted is merely limited to two, electrical doping of the channel cannot be adjusted for every region, and thus, the implementation of various multi-functional devices and circuits by using the effects of various n-p-n (p-n-p) junctions is limited.

In the reconfigurable electronic device according to the present invention, the lower electrodes are formed by using deposition, etching, and CMP (chemical mechanical polishing) processes which are compatible with the latest semiconductor standard processes, and thus, process reproducibility and process margin can be increased.

In addition, in the reconfigurable electronic device according to the present invention, the semiconductor material such as Si can be doped or the lower electrodes are implemented by using metals having various work functions, and thus, the work function of the lower electrodes can be easily adjusted and the distance between the electrodes can be minimized, so that the function and the degree of integration can be advantageously maximized.

In addition, in the reconfigurable electronic device according to the present invention, at least one of the lower electrodes is configured to surround the side surfaces and the bottoms of the other lower electrodes, and thus, the area of the surrounding lower electrode is increased, so that the resistance can be reduced. In the case of surrounding a floated lower electrode, a coupling ratio between the floated lower electrode and the surrounding lower electrode is increased, so that the programming or erasing can be effectively performed. In addition, in the reconfigurable electronic device according to the present invention, the lower electrode for adjusting the threshold value of the body is configured to surround the bottoms of the other lower electrodes, so that, although the channel is shortened, the electric resistance of the lower electrode for adjusting the threshold value is minimized, so that the performance can be improved. The present invention is to solve the problems occurring in the reconfigurable electronic device and circuit implemented based on the Si nanowire (NW) device which is implemented by a top-down or bottom-up method of the related art. top-The following limitations intend to be solved by using a 2D material such as top-down-based graphene nanoribbon, TMDC (transition metal dichalcogenides), or phosphorene or by using a reconfigurable electronic device having non-volatile memory characteristics including a divided lower electrode structure capable of applying independent voltage based on a semiconductor thin film (Si thin film or Metal Oxide semiconductor thin film) or a bottom-up-based single-walled carbon nanotube (in the specification, if there is no particular comment, a carbon nanotube) (Single Walled Carbon Nanotubes; SWNTs). First, in the reconfigurable electronic device of the related art, in the implementation of the device using the junction between the Si nanowire and the Ni silicide, there is an essential problem in accurate control of the position of the junction, and in the implementation of the two top-gates, the two top-gates are not self-aligned with the junction, so that the parasitic resistance or the capacitance component is greatly increased. In order to solve the problem, in the present invention, gate electrodes are located in a lower portion so as to freely adjust the resistance of Schottky junction of the device; and in order to accurately control the positions of the gate electrodes, the source and drain electrodes, and the channel in the device, photolithography process is used, so that reproducibility of position control and adjustability of position are to be improved. Second, in the reconfigurable electronic device of the related art, in the changing of the type of the device (for example, nMOSFET→pMOSFET), a voltage is always applied to one of the two top-gates, and thus, voltage coupling with other wire lines and leakage current may occur, so that the degree of freedom of the wire lines is greatly decreased. In order to solve the problem, in the reconfigurable electronic device of the related art, although the non-volatile memory function can be applied to the gate insulating film, the Eot is increased, so that current driving performance is greatly deteriorated, and it is difficult to achieve miniaturization down to an infinitesimal channel length range (L<10 nm). In order to solve the problem, in the present invention, an lower electrode array which is independently applied with voltages and a lower gate insulating film including a non-volatile memory function are configured, and a body of a 1D or 2D material or a semiconductor thin film is introduced thereto, and after that, source and drain electrodes are formed by using a photolithography process. Therefore, in the present invention, by introducing the lower electrode structure, adjusting the channel threshold voltage and the Schottky barriers between the first and second upper electrodes and the body by using the lower electrodes, adjusting gates of a channel by using upper electrodes, the limitation in the gate insulating film which is thickened so as to include the memory function intends to be solved. Third, in the reconfigurable electronic device of the related art, even in the case where the device is operated as any type of the MOSFETs, one of the source and the drain necessarily has a Schottky junction, and thus, if a reverse bias is applied to the Schottky junction, large low-frequency noise occurring in the Schottky junction essentially limits applications of the device. As a reference, in the case where an electrically-formed junction becomes a drain junction and a Schottky junction between the source electrode and the channel layer is controlled by the gate electrode, although off current can be reduced, the positions of the source and the drain are arbitrarily changed in the circuit, which may be a large shortcoming in terms of the off current.

Fourth, in the reconfigurable electronic device of the related art, in order to adjust the Schottky barrier of the junction between the Si nanowire and the Ni silicide, upper gate electrodes are configured so as to surround the junctions located in the vicinity of the source and the drain. Therefore, the reconfigurable electronic device needs to be designed and implemented in consideration of a width of the upper gate electrode and a minimum separation distance between the electrode and the gate electrode or a line width (F). In this case, in consideration of the separation distance (F) between the gate electrodes as well as the width of the voltage-adjustable independent gate electrode formed between the channels, that is, the separation distance between the source and the drain, the reconfigurable electronic device needs to be implemented, so that the minimum channel length which can be implemented is increased. As a result, in miniaturization of the channel length, essential limitation occurs, and the area required to implement the reconfigurable unit device is increased, so that a degree of integration is lowered. In the present invention, in order to complement the shortcomings in terms of the degree of integration described above, a lower electrode for adjusting the Schottky barrier and the threshold value of the channel is located under the body, so that the area required to implement the independent lower electrode can be reduced while implementing the function of the independent lower electrodes. Therefore, the degree of integration can be improved.

Fifth, in the reconfigurable electronic device of the related art, in order to implement several independent gate electrodes on the upper layer of the channel, as the separation distance between the gate insulating film and the gate metal is minimized, the difficulty of the process of implementing multiple independent gate wire lines is increased due to the limitation in the minimum area for maintaining an adhesive force between the metal and the gate insulating film. Therefore, in the reconfigurable electronic device of the related art, there are various problems in process such as short-circuit between the metal wire lines or disconnection of infinitesimal independent gate wire lines. In addition, in the reconfigurable electronic device of the related art, there is a problem in that, as the number of independent gates is increased, the channel length is also increased. As a result, in the structure of the reconfigurable electronic device of the related art, as the number of independent gates which can be implemented is increased, the implementation of the multi-functional device which can be changed is limited. For example, in the case where the number of gate of the channel which can be adjusted is merely limited to two, electrical doping of the channel cannot be adjusted for every region, and thus, the implementation of various multi-functional devices and circuits by using the effects of various n-p-n (p-n-p) junctions is limited.

In the reconfigurable electronic device according to the present invention, the lower electrodes are formed by using deposition, etching, and CMP (chemical mechanical polishing) processes which are compatible with the latest semiconductor standard processes, and thus, process reproducibility and process margin can be increased.

In addition, in the reconfigurable electronic device according to the present invention, the semiconductor material such as Si can be doped or the lower electrodes are implemented by using metals having various work functions, and thus, the work function of the lower electrodes can be easily adjusted and the distance between the electrodes can be minimized, so that the function and the degree of integration can be advantageously maximized.

In addition, in the reconfigurable electronic device according to the present invention, at least one of the lower electrodes is configured to surround the side surfaces and the bottoms of the other lower electrodes, and thus, the area of the surrounding lower electrode is increased, so that the resistance can be reduced. In the case of surrounding a floated lower electrode, a coupling ratio between the floated lower electrode and the surrounding lower electrode is increased, so that the programming or erasing can be effectively performed.

In addition, in the reconfigurable electronic device according to the present invention, the lower electrode for adjusting the threshold value of the body is configured to surround the bottoms of the other lower electrodes, so that, although the channel is shortened, the electric resistance of the lower electrode for adjusting the threshold value is minimized, so that the performance can be improved.

In order to solve the above-described problems, according to a first aspect of the present invention, there is provided a reconfigurable electronic device including a substrate; a plurality of lower electrodes which are formed on the substrate and are electrically isolated from each other; a lower gate insulating film which is formed on the lower electrodes; a body which is formed on the lower gate insulating film; a first upper electrode which is formed on a first region of the body; a second upper electrode which is formed in a second region of the body to be separated from the first upper electrode by a predetermined distance; and an upper gate electrode which is formed on the body or on the body and the first and second upper electrodes with an upper gate insulating film interposed therebetween, wherein top surfaces of the lower electrodes are in contact with the lower gate insulating film, and at least one lower electrode surrounds a bottom and at least one side surface of each of the other lower electrodes.

In the reconfigurable electronic device according to the first aspect, preferably, the lower electrode surrounding the bottoms of the other lower electrodes is isolated from the substrate by an insulating film or is formed in a well shape to be electrically isolated from the substrate.

According to a second aspect of the present invention, there is provided a reconfigurable electronic device including a substrate; one or two or more lower electrodes which are formed on the substrate and are electrically isolated from each other; a lower gate insulating film which is formed on a partial region of the substrate and the lower electrodes; a body which is formed on the lower gate insulating film; a first upper electrode which is formed on a first region of the body; a second upper electrode which is formed on a second region on the body to be separated from the first upper electrode by a predetermined distance; and an upper gate electrode which is formed on the body or on the body and the first and second upper electrodes with an upper gate insulating film interposed therebetween, wherein top surfaces of the lower electrode and top surface of the partial region of the substrate are in contact with the lower gate insulating film, and the substrate surrounds bottoms and at least one of side surfaces of the lower electrodes, and wherein the substrate is operated as a lower electrode.

In the reconfigurable electronic devices according to the first and second aspects, preferably, a work function or a conductivity of the lower electrode is different from those of the other lower electrodes which are adjacent.

In the reconfigurable electronic devices according to the first and second aspects, preferably, the upper gate insulating film is formed on a partial or entire region of the body or on a partial or entire region of the body and the first and second upper electrodes.

In the reconfigurable electronic device according to the first aspect, preferably, the lower electrode of which bottom is surrounded by the other lower electrode is electrically floated.

In the reconfigurable electronic devices according to the first and second aspects, preferably, the reconfigurable electronic device further includes an inter-electrode insulating film located between the lower electrodes, wherein the lower gate insulating film is formed on top surfaces of the lower electrodes and a top surface of the inter-electrode insulating film.

In the reconfigurable electronic devices according to the first and second aspects, preferably, the lower gate insulating film is configured with a ferroelectric material, so that the lower gate insulating film can be programmed or erased according to voltages applied to the lower electrodes.

In the reconfigurable electronic devices according to the first and second aspects, preferably, the lower gate insulating film is configured with at least two or more layers of insulating films, and the adjacent layers are configured with materials having different energy band gaps and dielectric constants, and wherein at least one layer of the insulating films constituting the lower gate insulating film can store charges.

In the reconfigurable electronic devices according to the first and second aspects, preferably, the reconfigurable electronic device further includes a buffer layer for improving interface characteristics between the body and the upper gate insulating film.

According to a third aspect of the present invention, there is provided an operation method for the reconfigurable electronic device, voltages are applied to the lower electrodes so that the lower gate insulating film is programmed or erased, and a degree of the programming or erasing is determined according to magnitudes of the voltages applied to the lower electrodes or time.

In the operation method for the reconfigurable electronic device according to the third aspect, preferably, the voltages applied to the lower electrodes are adjusted so that the degree of programming or erasing of the lower gate insulating film located under the first upper electrode and the lower gate insulating film located under the second upper electrode are changed, or one of the lower gate insulating film located under the first upper electrode and the lower gate insulating film located under the second upper electrode is programmed and the other is erased.

In the operation method for the reconfigurable electronic device according to the third aspect, preferably, the same voltage is applied to the first and second lower electrodes located under the first and second upper electrodes so that the lower gate insulating film is programmed or erased.

In the operation method for the reconfigurable electronic device according to the third aspect, preferably, voltages of the respective lower electrodes located under the first and second upper electrodes are adjusted to induce holes to one side of the body under the lower electrodes and induce electrons to the other side, so that the reconfigurable electronic device is operated as a p-n or n-p diode, or an additional lower electrode exists between the lower electrodes located under the first and second upper electrodes, a voltage of the lower electrode is adjusted to maintain neutrality of the body on the lower electrode or to induce electrons or holes to the body, so that the reconfigurable electronic device is operated as a p-n or n-p diode.

In the operation method for the reconfigurable electronic device according to the third aspect, preferably, voltages applied to the lower electrodes located under the first and second upper electrodes are adjusted to induce an electron layer to the body, so that the reconfigurable electronic device is operated as an n-type MOSFET or to induce a hole layer to the body, so that the reconfigurable electronic device is operated as a p-type MOSFET, or an additional lower electrode exists between the lower electrodes located under the first and second upper electrodes, a voltage of the lower electrode is adjusted to maintain neutrality of the body on the lower electrode or to induce electrons or holes to the body, so that a threshold value of a MOSFET is changed for operation.

The reconfigurable electronic device according to the present invention has the non-volatile memory function and includes a plurality of the lower electrodes. Due to the above feature, in the reconfigurable electronic device according to the present invention, in comparison with the reconfigurable electronic device of the related art, the degree of freedom of the wire lines for operation of the circuit is high, and the driving can be simplified.

In addition, in the reconfigurable electronic device according to the present invention, although externally-applied voltage is disconnected after the change of the polarity of the device by using the non-volatile memory function, the changed polarity is maintained, so that the leakage current and the electrical coupling between the wire lines can be remarkably reduced.

In addition, in the reconfigurable electronic device according to the present invention, the threshold value of the body can be adjusted by using one of the lower electrodes.

In addition, the reconfigurable electronic device according to the present invention is configured in such a structure that at least one of the lower electrodes surrounds the bottoms of the other lower electrodes, so that, although the channel is shortened due to the device miniaturization, the performance can be improved by minimizing the electric resistance of the surrounding lower electrode. In addition, in the case where the bottom and side surface of one lower electrode are surrounded by the other lower electrode and the one lower electrode is floated, the coupling ratio to the surrounding lower electrode is increased, and thus, the voltage of the floated electrode is efficiently adjusted, so that programming or erasing can efficiently performed. In addition, in this case, since the coupling ratio is increased, the lower electrodes of which bottoms are surrounded by the other lower electrode can be programmed and erased by the floating voltage.

In addition, in the reconfigurable electronic device according to the present invention, after the programming or erasing is performed by using the lower electrodes for a specific function, the lower electrodes may be allowed to be electrically floated, and in this case, the parasitic capacitance component occurring in the upper gate electrode or the first or second upper electrode can be reduced.

In addition, the reconfigurable electronic device according to the present invention introduces the structure where the upper gate electrode are used for driving the circuit and the lower electrodes are used for adjusting the polarities of the device, and thus, the lower electrodes including the non-volatile memory function of changing the polarities (for example, n-type or p-type) of the device and the upper gate electrodes used for actually operating the device as the circuit are located independently of each other. Due to this feature, in the reconfigurable electronic device according to the present invention, while the driving voltage in the circuit operation can be reduced, the non-volatile memory function can be efficiently included.

In addition, in the reconfigurable electronic device according to the present invention, the scaling of the upper gate insulating film can be freely performed. Therefore, there is an advantage in that the operation driving voltage can be lowered, and the device can be driven down to an infinitesimal channel region.

On the other hand, as recognized as problems of the reconfigurable electronic device of the related art, it is difficult to accurately adjust the position of the junction (for example, junction between Si and Ni silicide) in the process of forming silicide of Si and a transition metal in terms of process, and thus, the parasitic capacitance occurs, and it is difficult to accurately adjust the position of the gate electrode for adjusting the channel portion of the nanowire line and the junction region. Therefore, it is difficult to accurately adjust the threshold value of the channel. However, in the reconfigurable electronic device according to the present invention, the lower electrodes are formed prior to the formation of the insulating film and the body, and after that, the first and second upper electrodes are formed to be aligned by using the lower electrode as a reference, so that the position can be accurately controlled. Therefore, the area of the device can be minimized and the performance can be optimized.

In the case where the reconfigurable electronic device of the related art is configured so that the independent gate for adjusting the required Schottky batter is located in an upper portion, since the independent gate exists between the source and the drain, the reconfigurable electronic device needs to be designed in consideration of error margin in process. For this reason, the channel length of the reconfigurable electronic device is increased. As a result, there is a problem in that it is difficult to improve the degree of integration. However, in the reconfigurable electronic device according to the present invention, the lower electrodes functioning as the independent gate are located under the first and second upper electrodes, and thus, the length of the device is reduced, so that the degree of integration is improved.

In the reconfigurable electronic device of the related art, since the independent gate electrodes are located in an upper portion, there may be a limitation in the increase of the number of independent gate electrodes or the implementation using fine processes. Therefore, the number of independent gate electrodes is typically three or less. For this reason, in the reconfigurable electronic device of the related art, there is no function of locally adjusting the threshold value of the channel layer, and thus, there is a limitation in performing the localized electrical doping. Therefore, in the reconfigurable electronic device of the related art, the function of implementing an n-p-n or p-n-p junction by using the localized electrical doping in the channel is restricted. As a result, there is a problem in that it is difficult to implement various multi-functional devices.

However, the reconfigurable electronic device according to the present invention has an advantage in that three lower electrodes can be implemented under the body. The lower gate insulating film capable of storing charges exists between each of the lower electrodes and the body.

Due to such an advantage, in the reconfigurable electronic device according to the present invention, the above-described localized electrical doping can be performed. As a result, the change of the type (p-n diode⇔ n-p diode, n-type FET⇔ p-type FET) of the device, the modulation of the channel length, the implementation of various multi-functional devices such as diode logics can be performed. In addition, in the reconfigurable electronic device according to the present invention, in the implementation of the reconfigurable circuit, diversity of the function, the degree of freedom of driving of the device, and the degree of integration can be improved.

DETAILED DESCRIPTION OF THE INVENTION

According to the present invention, a reconfigurable electronic device is configured to include a lower gate insulating film and lower electrodes having a non-volatile memory function and a body and upper electrodes formed above the lower gate insulating film and the lower electrodes, so that the reconfigurable electronic device can be reconstructed as various forms of electronic devices by adjusting voltages applied to the lower electrodes and the upper electrodes. In particular, the reconfigurable electronic device according to the present invention is formed in a structure where one of the lower electrodes surrounds bottoms of the other lower electrodes or in a structure where a substrate is used as a lower electrode, so that a coupling ratio of the lower electrode can be increased and a resistance of the lower electrode can be minimized.

Hereinafter, exemplary embodiments of the present invention will be described with reference to the attached drawings.

First Embodiment

Figure 1:
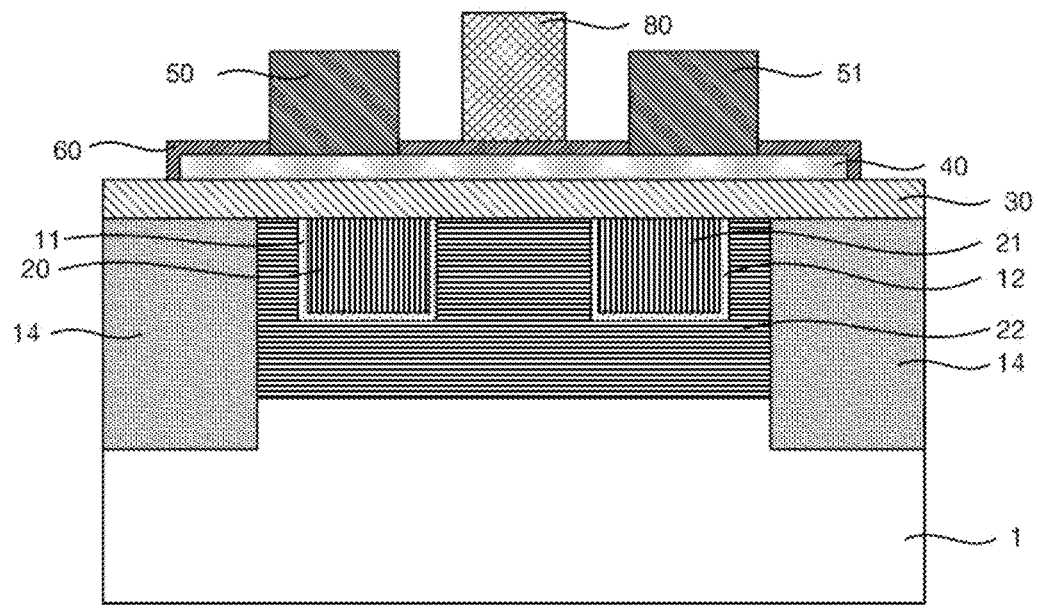
FIG. 1 is a cross-sectional diagram illustrating a reconfigurable electronic device according to a first embodiment of the present invention.

A configuration of a reconfigurable electronic device according to the first embodiment of the present invention will be described in detail. FIG. 1 is a cross-sectional diagram illustrating the reconfigurable electronic device according to the first embodiment of the present invention.

In FIG. 1, the reconfigurable electronic device according to the embodiment is a reconfigurable electronic device on the basis of a lower electrode having a non-volatile memory function and is configured to include: a substrate 1; a plurality of lower electrodes 20, 21, and 22 which are formed on the substrate to be electrically isolated from each other; inter-electrode insulating films 11 and 12; an isolation insulating film 14 for electrical isolation from adjacent different devices; a lower gate insulating film 3 formed on the lower electrodes; a body 40 formed on the lower gate insulating film; a first upper electrode 50 formed in a first region on the body; a second upper electrode 51 formed in a second region on the body to be separated by a predetermined distance from the first upper electrode; and an upper gate electrode 80 formed above the body with an upper gate insulating film 60 interposed therebetween.

In particular, top surfaces of the lower electrodes 20, 21, and 22 are in contact with the lower gate insulating film 30, and at least one lower electrode 22 encloses bottoms of other lower electrodes 20 and 21.

Hereinafter, components of the reconfigurable electronic device according to the embodiment will be described in detail.

The upper gate electrode 80 may be formed above the body with the upper gate insulating film interposed therebetween or may be formed above the body, a portion of the first and second upper electrodes, or the entire area thereof with the upper gate insulating film interposed therebetween.

Figure 4:
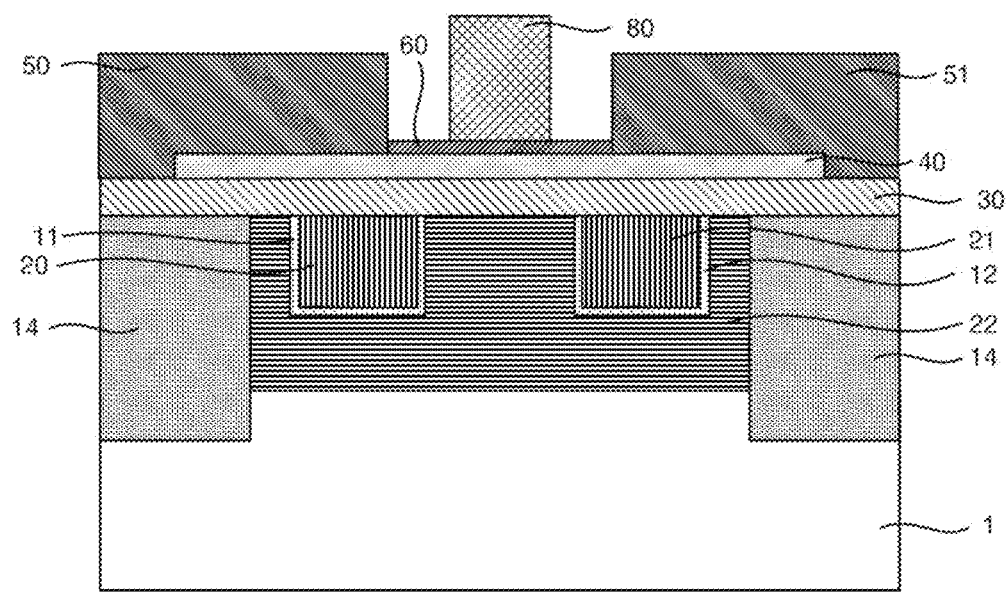
FIG. 4 is a cross-sectional diagram exemplarily illustrating another embodiment of first and second upper electrodes in the reconfigurable electronic devices according to the present invention.

In the reconfigurable electronic device according to the embodiment, in the case where the first upper electrode and the second upper electrode are formed ahead, the upper gate insulating film 60 may be configured so as to overlap a portion thereof or the entire thereof. In addition, the case where the reconfigurable electronic device according to the embodiment is configured to include three lower electrodes is exemplified. However, as illustrated in FIG. 4, the reconfigurable electronic device may be configured to include two lower electrodes. Besides, the reconfigurable electronic device may be configured to include a plurality of the lower electrodes, for example, three or more lower electrodes.

The substrate 1 may be configured with an insulating material or may be configured with a semiconductor material such as Si.

Preferably, the lower electrodes 20, 21, and 22 are formed above the substrate, and some lower electrodes 20 and 21 are located under the first upper electrode 50 and the second upper electrode 51. In this case, the lower electrodes may be located so as to be entirely aligned with or partially overlapped by the first and second upper electrodes.

In addition, preferably, the top surfaces of all the lower electrodes are configured to be in contact with the lower gate insulating film 30. In addition, preferably, at least one lower electrode 22 is formed with a structure where the lower electrode 22 extends to the bottom surfaces of the other lower electrodes to surround the bottom surfaces. Due to the structure, an area of the bottom surface of the lower electrode surrounding the bottoms of the other lower electrodes is maximized, so that an electric resistance of the lower electrode can be minimized.

Due to the structure, a coupling ratio of the lower electrodes, each of which bottom and at least one side surface are surrounded by the other lower electrode, can be increased.

The lower electrode 22 surrounding the bottoms of the other lower electrodes may be electrically connected to the substrate. Alternatively, the lower electrode surrounding the bottoms of the other lower electrodes is formed in a well shape on the substrate so as to be electrically isolated from the substrate.

The lower electrode 22 surrounding the bottoms of the other lower electrodes is configured so that the top surface is located under the upper gate insulating film 60, and thus, the lower electrode can be used to adjust a threshold value of a channel which is to be formed in the body 40.

On the other hand, the lower electrodes of which bottoms are surrounded by the lower electrode 22 may be floated, and thus, electrons or holes can be effectively stored in or erased from a charge storage layer existing in the lower gate insulating film on the top surfaces of the floated lower electrodes due to the increased coupling ratio. The lower gate insulating film can be programmed or erased by a floating voltage.

The inter-electrode insulating films 11 and 12 are formed between adjacent lower electrodes so as to electrically isolate the lower electrodes.

Preferably, a work function or a conductivity of the lower electrode surrounding the bottoms of the other lower electrodes is different from those of the lower electrodes of which bottoms are surrounded. In particular, the lower electrodes are configured with highly doped semiconductor areas, and the adjacent lower electrodes are configured so as to be doped with different types of impurities.

In the reconfigurable electronic device according to the first embodiment, a doped silicon or metal material is deposited on the substrate 1 configured with Si semiconductor or the like, the lower electrode 22 is formed, and patterning is performed by a photolithography process, so that the additional electrically-isolated lower electrodes 20 and 21 can be formed. In addition, in order to form the additional electrically-isolated lower electrodes 20 and 21 on the lower electrode 22, besides the formation method using the deposition process and the post photolithography process, a method of depositing a metal selected in consideration of process convenience and electric operating characteristics of the device on a photo-sensitive film patterned by a photolithography process and, after that, performing a lift-off process may be used. In this case, preferably, the positions of the lower electrodes are defined so as to be aligned with the first and second upper electrodes or so as to have a predetermined offset with respect to the first and second upper electrodes in the post process.

Second Embodiment

A reconfigurable electronic device according to a second embodiment of the present invention is configured to further include an insulating film 10 between the lower electrode and the substrate in the electronic device according to the first embodiment, so that the lower electrodes and the substrate are electrically isolated.

Figure 2:
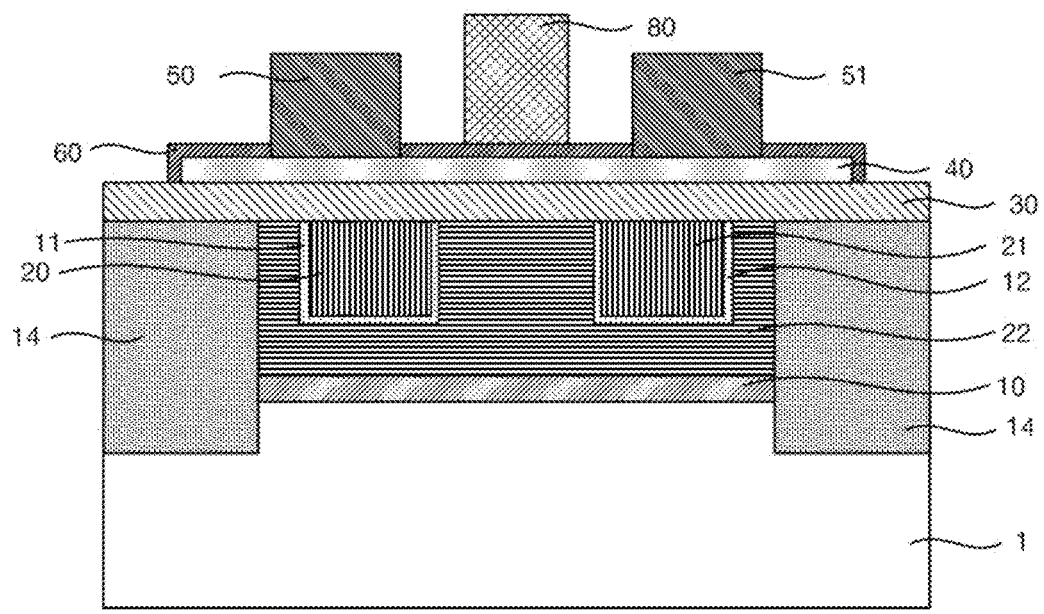
FIG. 2 is a cross-sectional diagram illustrating a reconfigurable electronic device according to a second embodiment of the present invention.

FIG. 2 is a cross-sectional diagram illustrating the reconfigurable electronic device according to the second embodiment of the present invention.

Referring to FIG. 2, in the case where the substrate is configured with a semiconductor material or a conductive material, preferably, the electronic device further includes the insulating film 10 between the substrate and the lower electrodes, so that the lower electrodes are electrically isolated from the substrate.

In particular, preferably, the entire bottom surface of the lower electrode surrounding the other lower electrodes is in contact with the insulating film 10.

Due to the configuration of the lower electrodes, an area of the bottom surface of the lower electrode surrounding the bottoms of the other lower electrodes is maximized, so that a resistance of the lower electrode can be minimized.

In the reconfigurable electronic device according to the second embodiment, the insulating film 10 is deposited on the substrate 1 configured with Si semiconductor or the like or the insulating film 10 is formed on the substrate through growth (oxidation) of a thermal oxidation film, the third lower electrode 22 is formed by depositing a doped silicon or metal material on the insulating film 10, and patterning is performed by a photolithography process, so that the electrically-isolated first and second lower electrodes 20 and 21 can be formed. In this case, the first and second lower electrodes are electrically isolated by the third lower electrode and the inter-electrode insulating film 11 interposed therebetween. In addition, in order to form the electrically-isolated first and second lower electrodes 20 and 21 on the third lower electrode, besides the formation method using the deposition process and the post photolithography process, a method of depositing a metal selected in consideration of process convenience and electric operating characteristics of the device on a photo-sensitive film patterned by a photolithography process and, after that, performing a lift-off process may be used. In this case, preferably, the positions of the lower electrodes are defined so as to be aligned with the first and second upper electrodes or so as to have a predetermined offset with respect to the first and second upper electrodes in the post process.

Third Embodiment

A reconfigurable electronic device according to a third embodiment of the present invention is configured so that the substrate of the electronic device according to the first embodiment is operated as a lower electrode.

Figure 3:
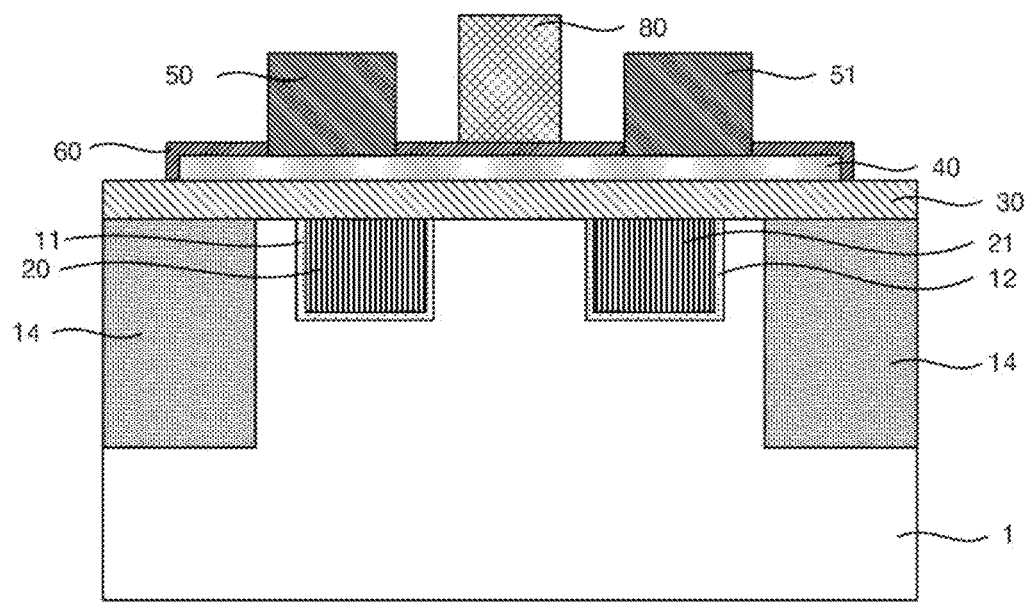
FIG. 3 is a cross-sectional diagram illustrating a reconfigurable electronic device according to a third embodiment of the present invention.

FIG. 3 is a cross-sectional diagram illustrating the reconfigurable electronic device according to the third embodiment of the present invention. Referring to FIG. 3, the reconfigurable electronic device according to the embodiment is configured to include a substrate 1; one or two or more lower electrodes 20 and 21 which are formed on the substrate and are electrically isolated from the substrate; a lower gate insulating film 30 which is formed on a portion of the substrate and the lower electrodes; a body 40 which is formed on the lower gate insulating film; a first upper electrode 50 which is formed on a first region of the body; a second upper electrode 51 which is formed on a second region of the body and is separated from the first upper electrode by a predetermined distance; and an upper gate electrode 80 which is formed on the body with an upper gate insulating film interposed therebetween.

The top surfaces of the lower electrodes and the top surface of partial areas of the substrate are in contact with the lower gate insulating film, and the lower electrodes are formed in the substrate 1, so that the bottoms of the lower electrodes are surrounded by the substrate.

In the reconfigurable electronic device according to the embodiment having the above structure, the substrate is operated as a lower electrode. In this case, in order to operate the substrate as a lower electrode, a dope concentration of the upper portion of the substrate can be increased.

The components of the reconfigurable electronic devices according to the first to third embodiments will be described more in detail.

In the reconfigurable electronic devices according to the first to third embodiments, the lower gate insulating film 30 is formed on the lower electrodes and is configured so as to be programmed or erased according to polarities of voltages applied to the first, second, and third lower electrodes. The lower gate insulating film 30 is configured with a single ferroelectric film or configured with at least two or more layers of insulating films. In the case where the lower gate insulating film is configured with two or more layers of the insulating films, preferably, the adjacent layers are formed to have different energy band gaps or different dielectric constants. Preferably, at least one layer of the insulating films constituting the lower gate insulating film is configured with a charge storage layer capable of storing charges.

FIGS. 10A to 10D are schematic diagrams illustrating various configurations of the lower gate insulating film 30 inducing a non-volatile memory function in the reconfigurable electronic devices according to the present invention.

Figure 10A:
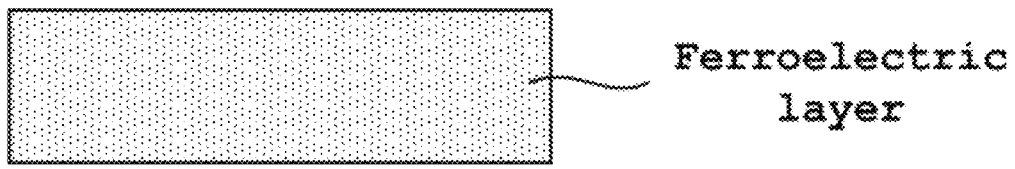
FIGS. 10A to 10D are schematic diagrams illustrating a configuration of a lower gate insulating film inducing a non-volatile memory function in the reconfigurable electronic devices according to the present invention; and, FIGS. 11A to 11C are representative cross-sectional diagrams illustrating a configuration of a body in the reconfigurable electronic device according to the present invention.

As illustrated in FIG. 10A, the lower gate insulating film can induce the non-volatile memory function by using a polarization phenomenon of a single thin film layer configured with a ferroelectric material based on an organic material (for example, PVDF) or a ferroelectric material based on an inorganic material (for example, PZT) if necessary. Insulating films having different dielectric constants or band gaps may be formed on at least one side (upper or lower side) of the ferroelectric layer.

Figure 10B:
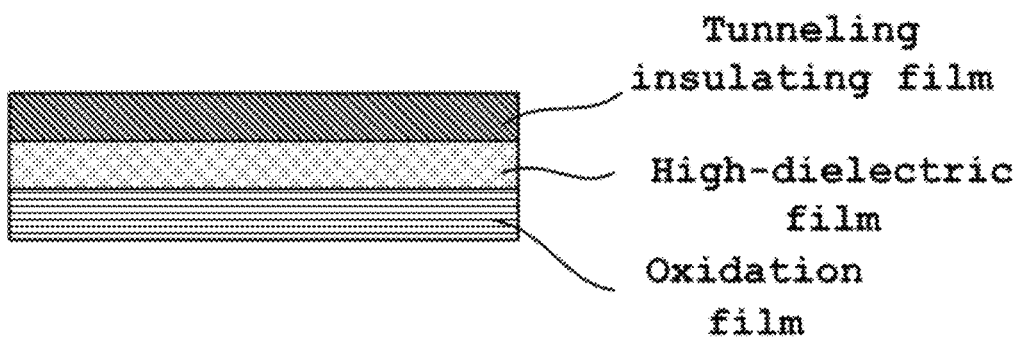
Figure 10C:
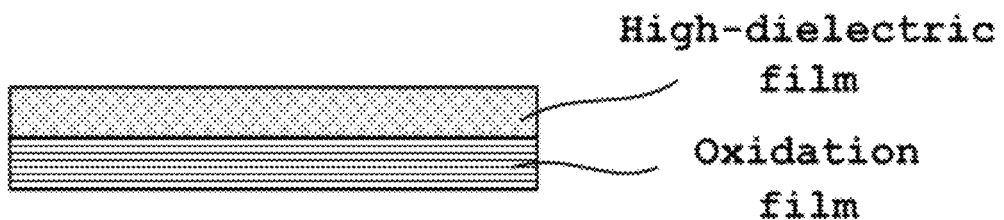
Figure 10D:

On the other hand, as illustrated in FIG. 10D, in the case where the lower electrodes are configured with a semiconductor material, the lower gate insulating film may be formed as a blocking insulating film based on a thermal oxidation film or may be formed as a deposited insulating film having various dielectric constants. In the case where the lower electrodes are configured with a metal, various high-dielectric insulating films may be used as the blocking insulating film.

In addition, as illustrated in FIG. 10C, the lower gate insulating film can be implemented in a two-layer structure by forming a blocking insulating film on the lower electrodes, forming a charge storage layer on the formed blocking insulating film. In addition, as illustrated in FIG. 10B, the lower gate insulating film can be implemented in a three-layer structure by forming a tunneling insulating film on the two-layer structure. Electrons or holes are tunneled through the tunneling insulating film in the body layer so as to be injected into the charge storage layer. The above-described three-layer structure can be configured with the tunneling insulating film/ the charge storage layer/the blocking insulating film (for example, oxide/silicon nitride/oxide, oxide/$HfO_2$/$Al_2O_3$, or the like).

In this manner, in programming or erasing of the lower gate insulating film, in the case where the lower gate insulating film includes the charge storage layer, the electrons or the holes can be stored through the programming or the erasing.

In the reconfigurable electronic devices according to the first to third embodiments, preferably, the body 40 is formed on the lower gate insulating film, and the body is configured with any one of a 1D (one-dimensional) nano material, a 2D (two-dimensional) nano material, a metal oxide thin film, a silicon thin film, a III-V group compound semiconductor thin film, and a II-VI group compound semiconductor thin film. The 1D nano material may include a Si nanowire, a carbon nanotube, or a graphene nanoribbon (NR). The 2D nano material may include a TMDC, a phospherene, or like. The metal oxide thin film may include an indium-gallium-zinc-oxide or the like. The silicon thin film may include a thin film of a single-crystal, polycrystal, or amorphous silicon material. The III-V group compound semiconductor thin film or the II-VI group compound semiconductor thin film may include GaAs, InAs, or the like.

Figure 11A:
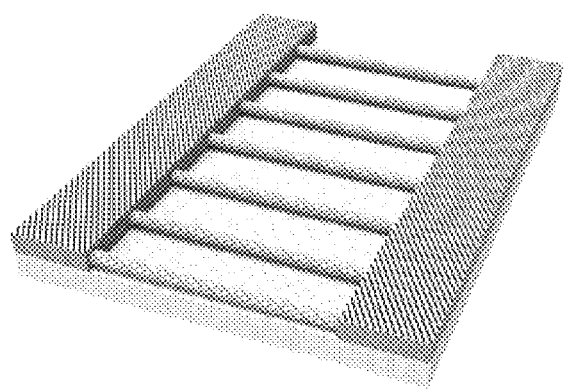
Figure 11B:
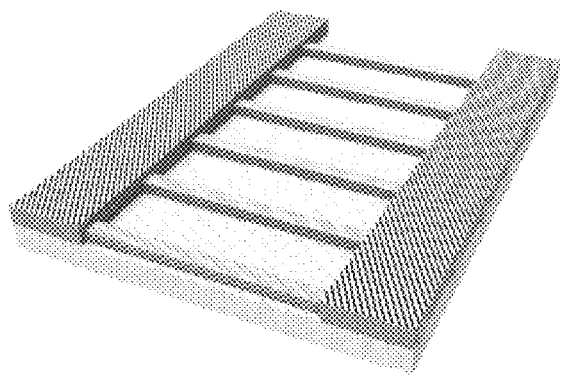
Figure 11C:
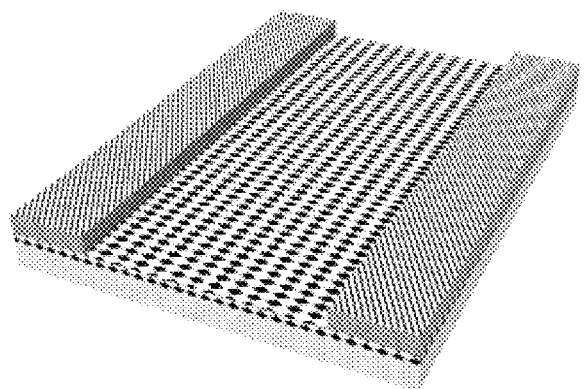

FIGS. 11A to 11C are representative perspective diagrams illustrating a configuration of the body in the reconfigurable electronic device according to the present invention. Referring to FIGS. 11A to 11C, a channel material can be implemented on the lower gate insulating film through a bottom-up or top-down process technique by laminating a 1D body layer based on a 1D nano material such as a Si nanowire, a carbon nanotube, or a graphene nanoribbon (NR) or laminating a semiconductor layer based on a 2D nano material such as a TMDC or a phospherene. Alternatively, the channel material can be implemented by sputtering or ALD-depositing a single-crystal, polycrystal, or amorphous silicon material or oxide semiconductor material (for example, indium-gallium-zinc-oxide, a-Si) as a thin film. FIG. 11A illustrates an example of implementation of the body in an exemplary reconfigurable electronic device where semiconductor-type carbon nanotubes (semiconducting single walled carbon nanotubes; s-SWNTs) are applied as a representative 1D body layer.

FIG. 11B illustrates an example where nanowire lines prepared in a top-down manner is introduced. The graphene may be implemented by patterning. FIG. 11C illustrates a device where a 2D material is applied as a body, and a 2D body layer can be implemented by using a material having an energy band gap. As an example, TMDCs (transitionmetal dichacogenides; $MoS_2$, $WSe_2$, $WS_2$), a phospherene, or the like can be applied. In addition, an amorphous, polycrystal, or single-crystal semiconductor thin film can be applied. FIGS. 11A to 11C illustrate an example of the structure where the first and second upper electrodes are formed after the formation of the channel material. However, the first and second upper electrodes may be formed before the formation of the channel material.

In the reconfigurable electronic devices according to the first to third embodiments, a portion or all of the first upper electrode 50 and the second upper electrode 51 is formed on the body. Edges of the first and second upper electrodes are formed so as to be aligned with edges of the facing lower electrodes so that the first and second upper electrodes are aligned with the respective lower electrodes located under the first and second upper electrodes, or a portion or all of the first and second upper electrodes is formed to be aligned with the lower electrodes or to have a predefined offset.

In the reconfigurable electronic devices according to the first to third embodiments, the upper gate insulating film 60 is formed on the body. In the case where the upper gate insulating film 60 is formed between the body 40 and the upper gate electrode 80 or the upper gate electrode 80 is formed so as to overlap a portion of the first and second upper electrodes, the upper gate insulating film is necessarily formed between the upper gate electrode and the first and second upper electrodes as well as between the upper gate electrode and the body.

In the implementation of the upper gate insulating film 60 on the body, in order to prevent deterioration in device characteristics caused by interface charge trap existing between a semiconductor layer of a 1D or 2D nano material constituting the body and the upper gate insulating film, preferably, a chemical or physical surface treatment process such as $O_2$, $N_2$, or Ar plasma treatment is performed on the top surface of the body layer, and after that, the upper gate insulating film is formed on the body.

For low voltage driving, the upper gate insulating film 60 may be implemented as a single layer configured with a typical high dielectric material or two or more layers of materials having different dielectric constants.

On the other hand, in order to improve interface characteristics between the body layer and the upper gate insulating film, preferably, chemical or physical surface treatment is performed on the surface of the body layer, and as an example, UV surface treatment is performed so that a hydrophobic surface can be changed into a hydrophillic surface.

In the reconfigurable electronic devices according to the first to third embodiments, preferably, after the formation of the upper gate insulating film, the upper gate electrode 80 is configured by selecting a type of the electrode in consideration of a work function which is to influence a threshold value of the body and performing deposition without overlap of the first and second upper electrodes in order to minimize the parasitic electrostatic capacitance. In some cases, the upper gate electrode may be implemented so as to partially overlap a source and the second upper electrode as well as the body with the upper gate insulating film interposed therebetween. In this case, the upper gate electrode formed with a transparent or non-transparent metal material can be implemented by various processes. As an example, an electron-beam vacuum deposition (e-beam evaporation) process and a lift-off process may be used. Alternatively, the electrode is formed by using a vacuum deposition process or a sputtering process, and after that, an existing patterning process may be used. In the device having the above structure, the upper gate electrode 80 is used as a terminal for applying a driving gate voltage for adjusting main operations of the circuit, and the independently-configured lower electrodes can be used as main gate electrode elements for adjusting a threshold voltage or a potential barrier of a Schottky barrier or determining an operation of a unit device or the circuit.

The upper gate electrode 80 is formed on the upper gate insulating film 60. The upper gate electrode 80 may be on the body between the facing first and second upper electrodes 50 and 51 with the upper gate insulating film interposed therebetween.

FIG. 4 is a cross-sectional diagram illustrating another embodiment of the first and second upper electrodes in the reconfigurable electronic devices according to the present invention. Referring to FIG. 4, in the reconfigurable electronic devices according to the first to third embodiments, the first and second upper electrodes 50 and 51 can be formed on the body 40 and the lower gate insulating film 30.

FIGS. 5 to 8 are cross-sectional diagrams illustrating various embodiments of the lower electrodes in the reconfigurable electronic devices according to the present invention.

Figure 5:
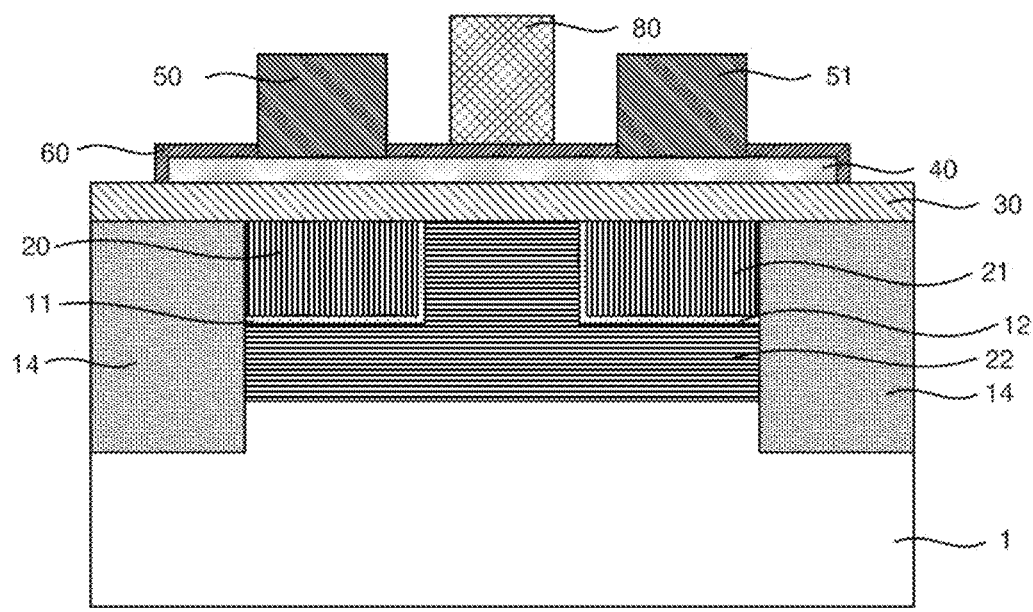
FIG. 5 is a cross-sectional diagram exemplarily illustrating another embodiment of lower electrodes in the reconfigurable electronic devices according to the present invention.

Referring to FIG. 5, in the reconfigurable electronic devices according to the first to third embodiments, one side surface of each of the lower electrodes of which bottoms are surrounded by the other lower electrode may be configured to be in contact with the isolation insulating film 14 for electric isolation between the devices. By doing so, the widths of the electrodes of which bottoms are surrounded can be formed to be further large, so that the resistance of the electrodes can be reduced. However, the coupling ratio is somewhat decreased.

Figure 6:
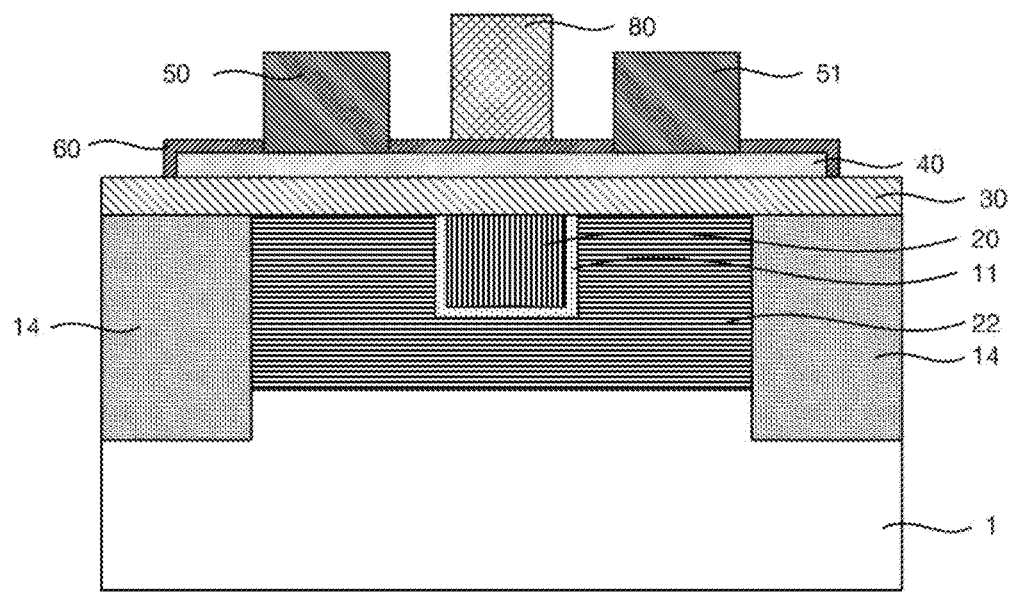
FIGS. 6 to 8 are cross-sectional diagrams exemplarily illustrating various embodiments of two lower electrodes in the reconfigurable electronic devices according to the present invention.

Referring to FIG. 6, the reconfigurable electronic devices according to the first to third embodiments is configured to include two lower electrodes 20 and 22, and one lower electrode 22 surrounds the bottom and the side surface of the other lower electrode 20. In this case, the reconfigurable electronic device may be configured so that the lower electrode 20 of which bottom is surrounded by the other lower electrode 22 is located under the upper gate electrode 80. The threshold voltage of the channel can be controlled by using the lower electrode of which bottom is surrounded.

Figure 7:
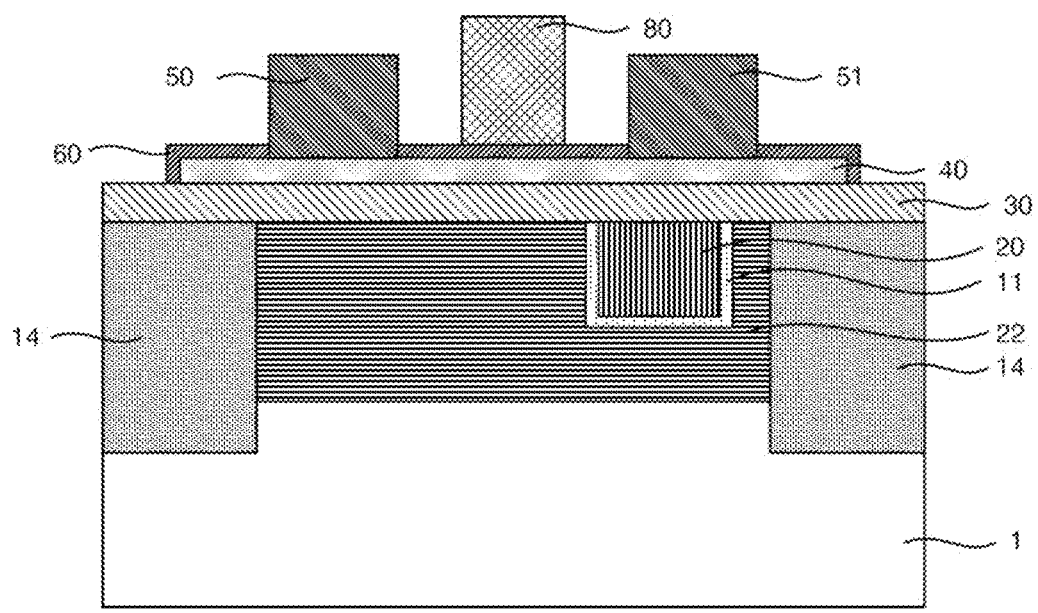
Figure 8:
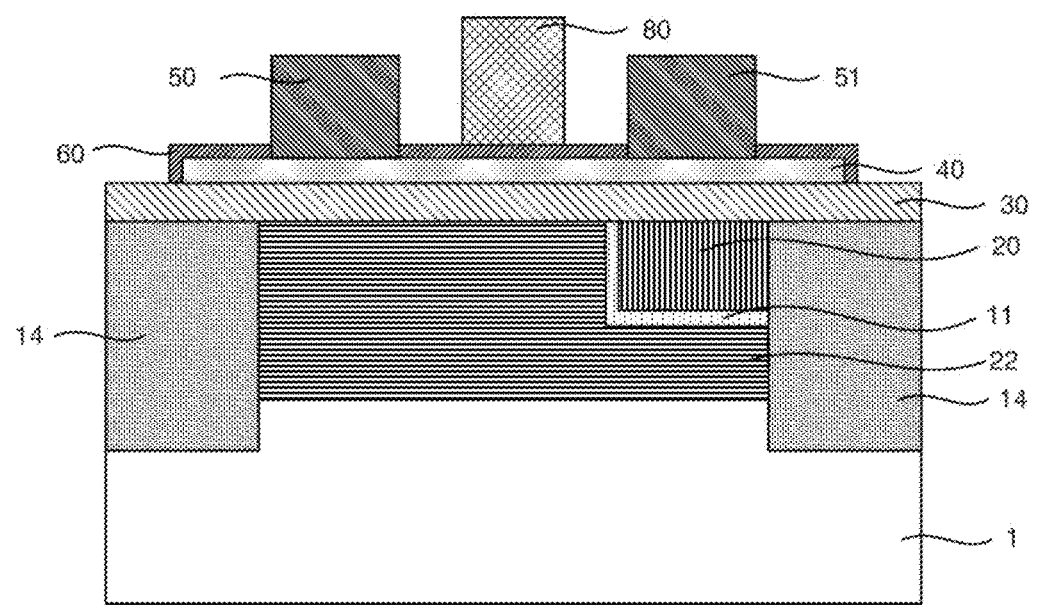

Referring to FIG. 7, the reconfigurable electronic device may be configured so that the lower electrode 20 of which bottom is surrounded by the other lower electrode 22 is located under one of the first and second upper electrodes. In this case, the lower electrode 20 may be located so as to be completely aligned or partially overlapped with the upper electrode. On the other hand, as illustrated in FIG. 8, the reconfigurable electronic device may be configured so that the lower electrode 20 of which bottom is surrounded by the other lower electrode 22 is located under one of the first and second upper electrodes and one side surface is in contact with the isolation insulating film 14 between the devices.

Figure 9:
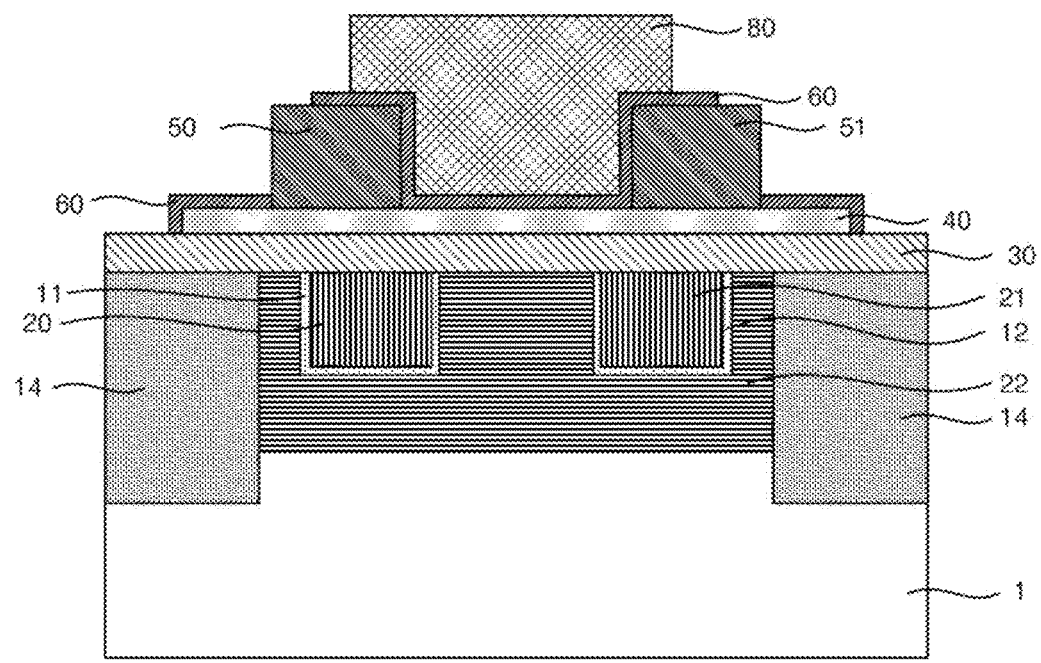
FIG. 9 is a cross-sectional diagram exemplarily illustrating another embodiment of an upper gate insulating film and an upper gate electrode in the reconfigurable electronic devices according to the present invention.

FIG. 9 is a cross-sectional diagram illustrating another embodiment of the upper gate insulating film and the upper gate electrode in the reconfigurable electronic device according to the present invention.

Referring to FIG. 9, in the reconfigurable electronic devices according to the first to third embodiments, the upper gate electrode 80 may be formed on a portion or all of the body 40 and the first and second upper electrodes 50 and 51 with the upper gate insulating film 60 interposed therebetween.

The reconfigurable electronic devices according to the first to third embodiments may further include a buffer layer between the body 40 and the upper gate insulating film 60. The buffer layer is formed between the body and the upper gate insulating film in order to improve interface characteristics between the body 40 and the upper gate insulating film 60. The buffer layer may be configured with an organic material or an inorganic material (for example, a spin on glass (SOG), SU8 (epoxy-based negative photoresist), octadecyltrichlorosilane (OTS), or octadecanethiol (ODT)).

In the implementation of the upper gate insulating film 60 on the body, in order to prevent deterioration in device characteristics caused by interface charge trap existing between a semiconductor layer of 1D or 2D nano material constituting the body and the upper gate insulating film, preferably, a buffer layer of an organic material or an inorganic material is formed on the surface of the body, and after that, the upper gate insulating film is formed on the buffer layer.

For lower voltage driving, the upper gate insulating film 60 may be implemented with a typical high dielectric material having a high dielectric constant on the buffer layer, for example, by using atomic layer deposition (ALD) or a sputtering process.

In the reconfigurable electronic devices according to the first to third embodiments, the distance between the lower electrodes located under the first and second upper electrodes is formed to be smaller than the distance between the first and second upper electrodes to decrease an effective channel length or is formed to be longer than the distance between the first and second upper electrodes to increase the effective channel length. Therefore, the distance between the lower electrodes formed under the first and second upper electrodes can be set according to the effective channel length of the electronic device.

[Manufacturing Process]

The above-described reconfigurable electronic device according to the present invention has a device structure where a plurality of the lower electrodes which are configured with a metal or a highly doped Si material and are electrically isolated are included and the distance between the first and second upper electrodes is formed to be smaller than the distance between the first and second upper electrodes to decrease the effective channel length or is formed to be longer than the distance between the first and second upper electrodes to increase the effective channel length. In addition, the upper electrodes and the lower electrode may be formed to be partially overlapped with each other with the body layer and the insulating films formed under and above the body layer interposed therebetween.

The lower gate insulating film having a non-volatile memory function is formed on the lower electrodes, and the lower gate insulating film may be configured with a single layer of an organic material or an inorganic material or may be configured with two or more layers of insulating films. In the case where the lower gate insulating film is configured with two or more layers of insulating films, the energy band gaps and the dielectric constants of the adjacent layers are different from each other.

The body is formed by locating a semiconductor material having an energy band gap such as a 1D channel material (Si, III-V NW, SWNTs, graphene nanoribbon, or the like) or a 2D channel material (TMDC, $MoS_2$, $WSe_2$, $WS_2$, phosphorene, or the like) formed by using a top-down or bottom-up process platform on the lower gate insulating film. In addition, a metal oxide thin film or a semiconductor thin film can be used as a body layer.

Next, through a photolithography process, the first and second upper electrodes are formed on the body to be aligned with the first and second lower electrodes, and preferably, the first and second upper electrodes are configured with a material selected in consideration of compatibility between the material constituting the body and the work function. The upper gate insulating film which is compatible with the channel material is formed on the structure of the body and the first and second upper electrodes. In this case, if necessary, the buffer layer is formed by laminating a material of an organic material or an inorganic material for controlling interface characteristics or surface treatment (for example, $O_2$, $N_2$, or plasma treatment) is performed by using a semiconductor process, and after that, the upper gate insulating film having a characteristic of a high dielectric constant (for example, $HfO_2$, $Al_2O_3$, $TiO_2$, $ZrO_2$, $SiN_x$, or the like) is formed on the body. The upper gate electrode is formed on the formed upper gate insulating film. The upper gate electrode is configured with transparent or non-transparent highly-conductive organic and inorganic materials in consideration of the work function and is formed in consideration of overlapping with the first and second upper electrodes. In consideration of parasitic components and device operation environment, the upper gate electrode may be configured in a structure to be entirely aligned with the body layer with the separation distance between the first and second upper electrodes or may be configured in a structure to be overlapped with partial regions of the first and second upper electrodes as well as the entire region of the body layer.

The characteristics of the reconfigurable electronic device are implemented by adjusting Schottky barriers located under the first and second upper electrodes by using voltages independently applied to the lower electrode gate array which can be independently applied with voltages. In order to adjust the Schottky barriers, through the programming/erasing operation performed on the first and second upper electrodes and the selected lower electrode, charges are injected into the charge storage layer of the lower gate insulating film having the non-volatile memory function.

In the implementation of the operations of the existing reconfigurable electronic device, the number of electrodes in the device required is increased, which causes a great problem in actual circuit implementation.

In order to solve the problem, the lower electrodes which can be independently applied with voltages are provided, and programming or erasing is performed on the charge storage layer to implement the non-volatile memory function, so that the Schottky potential barrier can be adjusted. In this case, although the gate voltage is not applied, the potential barrier is adjusted, so that the wire lines can be effectively implemented in the driving of the reconfigurable electronic device and circuit.

The reconfigurable electronic device of the related art disclosed in patent Document 1 has the non-volatile memory function by using the upper gate electrode structure, and the electrical operations of the device are adjusted by using the same gate insulating film. In this structure, the charge storage layer exists in the upper gate insulating film, and electrons or holes are injected into the charge storage layer. However, in a normal operation condition, there is a case where undesired charges are leaked out or introduced, so that a problem occurs in reliability. In the present invention, the lower electrodes for programming and erasing are prepared, and in a normal operation condition, the device is controlled by the upper gate, so that the aforementioned problem is solved. In addition, although the structure according to Patent Document 1 also uses the non-volatile memory function, since the degree of integration of the structure according to the present invention is 5 F and the degree of integration of the structure according to Patent Document 1 17.5 F, the structure according to Patent Document has great shortcoming in that the degree of integration is greatly lowered in comparison with the structure according to the present invention.

In addition, the first to fourth techniques in the related art has no non-volatile memory function, and if the function is added, a thick gate insulating film is required for the operations of the memory device, so that there is a problem in that an operation of infinitesimal channel cannot be implemented.

In addition, in terms of the degree of integration, in the first to fourth techniques in the related art, the length of the device is 10 F to 12 F, which is greatly deteriorated in comparison with the present invention (5 F). In addition, in the present invention, since the upper gate insulating film can be configured to be thin, so that there is no problem in device miniaturization.

In order to solve the problems of the first to fourth techniques in the related art described heretofore, in the reconfigurable electronic device according to the present invention, the Schottky barriers of the contact regions between the body layer and the first and second upper electrodes are adjusted by using the structure of the lower electrodes, and the upper gate electrodes located in the upper portion are mainly used for operation of the body layer. In some cases, the operation can be adjusted by applying a voltage to the lower electrode located under the channel.

[Example of Change in Operating Characteristics of Reconfigurable Electronic Device Including Lower Electrodes]

Hereinafter, examples of electronic devices which can be reconstructed by changing operating characteristics of the reconfigurable electronic devices according to the embodiments of the present invention will be described.

The reconfigurable electronic device according to the present invention can electrically implement a p-n diode. An example of this implementation will be described more in detail.

After the first upper electrode is grounded, a positive program voltage is applied to the lower electrode located under the first upper electrode to inject electrons into the lower gate insulating film having the charge storage layer, so that holes are electrically induced to the body located under the first upper electrode. After the second upper electrode is grounded, a negative voltage is applied to the lower electrode located under and in the vicinity of the second upper electrode to inject holes into the lower gate insulating film having the charge storage layer, so that electrons are induced to the body located under and in the vicinity of the second upper electrode. By doing so, electrically p-region and n-region are induced to the body, so that a p-n diode can be implemented.

In addition, the reconfigurable electronic device according to the present invention can electrically implement an n-p diode. Although the method of this implementation is similar to the above-described method for the p-n diode, the method has the following difference. In the above description, if the holes are injected into the charge storage layer by using the lower electrode located under the first upper electrode and the electrons are injected into the charge storage layer by using the lower electrode located under the second upper electrode, the n-p diode can be electrically implemented.

On the other hand, in the reconfigurable electronic device according to the present invention, in the case where an additional lower electrode is further included between the lower electrodes located under the first and second upper electrodes, the voltage of the additional lower electrode is adjusted to maintain neutrality of the body located on the additional lower electrode or to induce electrons or holes, so that the reconfigurable electronic device can be operated as a p-n diode or an n-p diode.

On the other hand, the reconfigurable electronic device according to the present invention can be driven as an n-type transistor having ideal ohmic characteristics or a p-type transistor having ideal ohmic characteristics. More specifically, holes are injected into the lower gate insulating film having a change storage layer located under the first and second upper electrodes by using the lower electrode, and thus, the potential barriers between the first and second upper electrodes and the body is reduced, and the induced electron layer is allowed to function as a doped source/drain region of an existing n-type MOSFET, so that the reconfigurable electronic device can be driven as an n-type MOSFET. In this case, the junctions between the first and second upper electrodes and the body can be adjusted to be similar to ohmic junctions On the other hand, voltages of which polarities are opposite to those of the above-described n-type MOSFET are applied to the lower electrodes, and thus, electrons can be stored, so that the reconfigurable electronic device according to the present invention can be driven as a p-type transistor.

On the other hand, in the reconfigurable electronic device according to the present invention, in the case where an additional lower electrode is further included between the lower electrodes located under the first and second upper electrodes, the voltage of the additional lower electrode is adjusted to maintain neutrality of the body located on the additional lower electrode or to induce electrons or holes, so that a threshold value of the MOSFET can be changed for operation.

As a result, in the reconfigurable electronic device according to the present invention, the n-type transistor and the p-type transistor having ohmic contact characteristics can be independently implemented in the same device structure by adjusting program/erase voltage applied from the outside without additional process or change in structure.

Although the reconfigurable electronic devices of the related art are implemented to be freely changed from a transistor to a diode or from a diode to a transistor in the same device structure, since the number of independent gate electrodes required for changing the types is limited, there is a problem in that it is difficult to implement localized electrical doping within a nano-sized channel in an n-p-n or p-n-p form due to characteristics in device structure.

On the contrary, in the reconfigurable electronic devices according to the present invention, the structure based on the lower electrodes is used, so that localized electrical doping is available. In addition, unlike existing devices, in the reconfigurable electronic devices according to the present invention, the non-volatile memory function can be implemented by using the lower gate insulating film and the lower electrodes having signal layered or multi-layered memory characteristics.

The first technique in the related art was published by Nam LAB (Germany). In the technique, a junction of Si nanowire and Ni silicide is formed, and band alignment exists almost in the vicinity of mid-gap within the band gap of the Si nanowire. As a result, the device has potential barriers having almost similar sizes in terms of electrons and holes. Two upper electrodes are formed above the junction of the Si and the Ni silicide. By using the two independent upper electrodes which are independently formed in the vicinity of the source and drain regions, the type (n-type or p-type) of the device is adjusted, so that the reconfigurable electronic device can be implemented. However, the device has no non-volatile memory function, the device is configured with one body layer, and the position of the junction of the Si and the Ni silicide cannot be adjusted accurately during the process, so that parasitic capacitance may be increased. As a result, there is a problem in that power consumption is also increased. For the implementation of the reconfigurable electronic device, the number of independent nodes is required to be at least four, and the change of simple types (n-type or p-type) of the device is available, but there is a restriction in terms of various reconstructing functions such as channel length modulation. The Schottky barrier can be adjusted, and the device is compatible with bottom-up and top-down processes. However, there is a restriction in terms of process compatibility with a 1D or 2D material.

The second technique in the related art published by Joseph Fourier University in France is a reconfigurable electronic device having multiple functions for changing types. The device uses a device structure which is almost similar to the first technique in the related art except that, in addition to two independent upper gate electrodes capable of adjusting Schottky barrier, an independent upper gate electrode for adjusting channel characteristics of the device is additionally formed at the center of the channel.

The technique does not use a technique of a non-volatile memory device. In addition, like the first technique in the related art, the parasitic capacitance is large, and the minimum area for implementing the device is as large as 20 F2 (assuming that the size is 2 F in the direction of channel width of the device).

Although the threshold voltage of the channel can be independently adjusted, in order to introduce a plurality of independent gate electrodes in the channel, the size of the device needs to be disadvantageously increased. Since the upper gate structure is used, there is a problem in that there are many restrictions in order to implement the concept of increasing the number of terminals by using a high resolution process.

The third technique in the related art published by Ecole Polytechnique in Switzerland is a device as a combination of the two independent upper electrodes for adjusting Schottky barrier in the first technique in the related art. In addition, like the second technique in the related art, the device has a device structure where the upper gate electrode for adjusting the channel region is included. Therefore, the minimum area for implementing the device is about 20 F2 like the first technique in the related art. Since the two independent upper electrodes are combined as one, the device has a structure where the source and the drain cannot be exchanged in use at the time of implementation of a reconfigurable circuit. As a result, there is restriction in diversity of implementation of the reconfigurable circuit and a driving scheme.

The third technique in the related art has no non-volatile memory function, and the body layer is implemented by using only the top-down process as disclosed in Patent Document 2.

The fourth technique in the related art published by Prof. Hong's group in Seoul National University is a method of implementing a reconfigurable electronic device by introducing two body layers and a non-volatile memory function. Since two channel layers are used, there is a problem in that the parasitic capacitance is large. In terms of a degree of integration of the device, since the minimum area for implementing the device is as large as 35 F2, there is a problem in that the degree of integration is low. In addition, since two channels are used, there is a problem in that the number of independent nodes is at least six in order to operate as a reconfigurable electronic device. Since there is no function of changing the type (n-type or p-type) of the device in the same channel and the device having two independent channels is used for implementing the reconfigurable electronic device, there is a limitation in implementing multi-function. In addition, since one gate electrode is used to overlap the entire region of the channel layer, there is a problem in that Schottky barrier cannot be locally changed between the channel layer and source and the second upper electrode. Therefore, although a reconfigurable electronic device can be implemented, the device structure has a limitation in terms of function and shortcomings in terms of a degree of integration and dynamic power consumption.

It is the prevent invention where a non-volatile memory structure is first used for implementing a reconfigurable electronic device. In the related art, there is no precedent example where a non-volatile memory function is introduced into a reconfigurable electronic device. Although the reconfigurable electronic device disclosed in Patent Document 1 has characteristics of a non-volatile memory, it can be understood that, since the device structure is not a signal channel structure, the parasitic resistance and capacitance of the device are large and the degree of integration is greatly lowered. In terms of the degree of integration, the unit device area is 35 F2, which is very small.

In the device structure according to the present invention, in consideration of one upper gate electrode, a plurality of lower electrodes, and separation between the lower electrodes during the process, the minimum device length of the unit reconfigurable electronic device is 4 F. On the contrary, in the reconfigurable electronic device based on multi-function according to the second technique in the related art, the device length is as large as 11 F. When the device widths are assumed to be the same, the degree of integration of the device according to the related art is increased about two times.

In addition, in terms of various device characteristics such as parasitic resistance component, power consumption, the number of wire lines required for implementing a reconfigurable circuit operation, functional diversity of a multi-function device, alignment during a process, adjustment of Schottky contact resistance, compatibility with bottom-up and top-down methods in process, and compatibility with 1D or 2D material, the reconfigurable electronic device according to the present invention is advantageous in comparison with the techniques in the related art.

The reconfigurable electronic device according to the present invention exhibits various reconfigurable electronic device characteristics as follows.

First, the contact resistance between the first and second upper electrodes and the body can be controlled by adjusting the program and erase characteristics using the respective lower electrodes located under the first and second upper electrodes, and the n-type and p-type regions are electrically implemented, so that the device can be reconstructed.

Second, the device threshold value in the channel can be adjusted by using the lower electrode located under the body, and a device having a different threshold value can be implemented in a circuit from the same type of the device. In particular, the lower electrode located under the body is configured to surround the bottoms of the other lower electrodes so as to allow the bottom surface to extend, so that the electric resistance of the lower electrode can be minimized.

Third, by adjusting widths or positions of the lower electrodes located under the first and second upper electrodes or performing localized electrical doping into the body by using the lower electrode surrounding the other lower electrodes, the channel length of the device can be electrically adjusted.

Fourth, the potential barriers between the body layer and the first and second upper electrodes are modulated by adjusting the program and erase characteristics using the lower electrodes located under the first and second upper electrodes, so that the device structure can be operated as a Schottky diode, and the potential barrier of the diode can be adjusted variously through the programming and the erasing.

Fifth, injection of electrons or holes can be adjusted by using potential difference between the lower electrodes and the first and second upper electrodes in the same device, and thus, the type (p-type or n-type FET, p-n or n-p diode, or Schottky diode) of the device can be freely changed.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A reconfigurable electronic device comprising:
   a substrate;
   a plurality of lower electrodes which are formed on the substrate and are electrically isolated from each other;
   a lower gate insulating film which is formed on the lower electrodes;
   a body which is formed on the lower gate insulating film;
   a first upper electrode which is formed on a first region of the body;
   a second upper electrode which is formed in a second region of the body to be separated from the first upper electrode by a predetermined distance; and
   an upper gate electrode which is formed on the body or on the body and the first and second upper electrodes with an upper gate insulating film interposed therebetween,
   wherein top surfaces of the lower electrodes are in contact with the lower gate insulating film, and at least one lower electrode surrounds a bottom and at least one side surface of each of the other lower electrodes.

2. The reconfigurable electronic device according to claim 1, wherein the lower electrode surrounding the bottoms of the other lower electrodes is isolated from the substrate by an insulating film or is formed in a well shape to be electrically isolated from the substrate.

3. The reconfigurable electronic device according to claim 1, wherein a work function or a conductivity of the lower electrode surrounding the bottom of the other lower electrodes is different from those of the other lower electrodes.

4. The reconfigurable electronic device according to claim 1, wherein the upper gate insulating film is formed on a partial or entire region of the body or on a partial or entire region of the body and the first and second upper electrodes.

5. The reconfigurable electronic device according to claim 1, wherein the lower electrode of which bottom is surrounded by the other lower electrode is electrically floated.

6. The reconfigurable electronic device according to claim 1, further comprising an inter-electrode insulating film located between the lower electrodes, wherein the lower gate insulating film is formed on top surfaces of the lower electrodes and a top surface of the inter-electrode insulating film.

7. The reconfigurable electronic device according to claim 1, wherein the lower gate insulating film is configured with a ferroelectric material, so that the lower gate insulating film can be programmed or erased according to voltages applied to the lower electrodes.

8. The reconfigurable electronic device according to claim 1,
wherein the lower gate insulating film is configured with at least two or more layers of insulating films, and the adjacent layers are configured with materials having different energy band gaps and dielectric constants, and
wherein at least one layer of the insulating films constituting the lower gate insulating film can store charges.

9. The reconfigurable electronic device according to claim 1, further comprising a buffer layer for improving interface characteristics between the body and the upper gate insulating film.

10. The reconfigurable electronic device according to claim 1, wherein two end portions of the upper gate electrode are aligned with end portions of the first and second upper electrodes with the upper gate insulating film interposed therebetween or are partially or entirely overlapped with the first and second upper electrodes with the upper gate insulating film interposed therebetween.

11. The reconfigurable electronic device according to claim 1, wherein the body is configured with one of a 1D nano material, a 2D nano material, a metal oxide thin film, a germanium (Ge) thin film, a SiGe thin film, a silicon thin film, a III-V group compound semiconductor thin film, and a II-VI group compound semiconductor thin film.

12. An operation method for the reconfigurable electronic device according to claim 1,
wherein voltages are applied to the lower electrodes so that the lower gate insulating film is programmed or erased, and
wherein a degree of the programming or erasing is determined according to magnitudes or time duration of the voltages applied to the lower electrodes.

13. The operation method according to claim 12, wherein the voltages applied to the lower electrodes are adjusted so that the degree of programming or erasing of the lower gate insulating film located under the first upper electrode and the lower gate insulating film located under the second upper electrode are changed, or one of the lower gate insulating film located under the first upper electrode and the lower gate insulating film located under the second upper electrode is programmed and the other is erased.

14. The operation method according to claim 12, wherein the same voltage is applied to the first and second lower electrodes located under the first and second upper electrodes so that the lower gate insulating film is programmed or erased.

15. The operation method according to claim 12,
wherein in the programming or erasing, the same voltage (including 0 V) is applied to the first and second upper electrodes,
wherein a voltage is applied to the upper gate electrode but current is not flowed between the first and second upper electrodes, or
wherein a voltage is applied to the upper gate electrode and current is flowed between the first and second upper electrodes.

16. The operation method according to claim 12, wherein, prior to a procedure of the programming or the erasing, a predetermined voltage is applied to the upper gate electrode, or light is applied to the upper gate electrode.

17. The operation method according to claim 12,
wherein voltages of the respective lower electrodes located under the first and second upper electrodes are adjusted to induce holes to one side of the body under the lower electrodes and induce electrons to the other side, so that the reconfigurable electronic device is operated as a p-n or n-p diode, or
wherein an additional lower electrode exists between the lower electrodes located under the first and second upper electrodes, a voltage of the lower electrode is adjusted to maintain neutrality of the body on the lower electrode or to induce electrons or holes to the body, so that the reconfigurable electronic device is operated as a p-n or n-p diode.

18. The operation method according to claim 12,
wherein voltages applied to the lower electrodes located under the first and second upper electrodes are adjusted to induce an electron layer to the body, so that the reconfigurable electronic device is operated as an n-type MOSFET or to induce a hole layer to the body, so that the reconfigurable electronic device is operated as a p-type MOSFET, or
wherein an additional lower electrode exists between the lower electrodes located under the first and second upper electrodes, a voltage of the lower electrode is adjusted to maintain neutrality of the body on the lower electrode or to induce electrons or holes to the body, so that a threshold voltage value of a MOSFET is changed for operation.

19. A reconfigurable electronic device comprising:
a substrate;
one or two or more lower electrodes which are formed on the substrate and are electrically isolated from each other;
a lower gate insulating film which is formed on a partial region of the substrate and the lower electrodes;
a body which is formed on the lower gate insulating film;
a first upper electrode which is formed on a first region of the body;
a second upper electrode which is formed on a second region of the body to be separated from the first upper electrode by a predetermined distance; and
an upper gate electrode which is formed on the body or on the body and the first and second upper electrodes with an upper gate insulating film interposed therebetween, wherein top surfaces of the lower electrode and top surface of the partial region of the substrate are in contact with the lower gate insulating film, and the substrate surrounds bottoms and at least one of side surfaces of the lower electrodes, and wherein the substrate is operated as a lower electrode.

* * * * *